(12) United States Patent
Bhat et al.

(10) Patent No.: US 8,459,128 B2
(45) Date of Patent: Jun. 11, 2013

(54) SUB-THRESHOLD ELASTIC DEFLECTION FET SENSOR FOR SENSING PRESSURE/FORCE, A METHOD AND SYSTEM THEREOF

(75) Inventors: Navakanta Bhat, Bangalore (IN); Rudra Pratap, Bangalore (IN); Malhi Charanjeet Kaur, Bangalore (IN)

(73) Assignee: Indian Institute of Science, Bangalore (IN)

( * ) Notice: Subject to any disclaimer, the term of this patent is extended or adjusted under 35 U.S.C. 154(b) by 307 days.

(21) Appl. No.: 12/937,638

(22) PCT Filed: Jun. 19, 2008

(86) PCT No.: PCT/IN2008/000387
§ 371 (c)(1),
(2), (4) Date: Oct. 13, 2010

(87) PCT Pub. No.: WO2009/128084
PCT Pub. Date: Oct. 22, 2009

(65) Prior Publication Data
US 2011/0023632 A1    Feb. 3, 2011

(30) Foreign Application Priority Data
Apr. 15, 2008 (IN) .................. 00929/CHE/2008

(51) Int. Cl.
*G01L 1/12* (2006.01)

(52) U.S. Cl.
USPC ...................... 73/862.626; 73/777

(58) Field of Classification Search
USPC ............................. 73/781, 777, 862.626, 760
See application file for complete search history.

(56) References Cited

U.S. PATENT DOCUMENTS

| | | | |
|---|---|---|---|
| 4,894,698 A | 1/1990 | Hijikigawa et al. | |
| 6,388,299 B1 * | 5/2002 | Kang et al. | 257/415 |
| 7,146,865 B2 * | 12/2006 | Wilner | 73/862.627 |
| 7,159,466 B2 * | 1/2007 | Hasegawa et al. | 73/721 |
| 8,163,570 B2 * | 4/2012 | Castex et al. | 438/5 |
| 2002/0172382 A1 | 11/2002 | Nakabayashi | |

FOREIGN PATENT DOCUMENTS

| | | |
|---|---|---|
| DE | 3635462 A1 | 4/1987 |
| DE | 4031369 A1 | 4/1992 |
| EP | 0157541 A2 | 10/1985 |
| EP | 0441324 A1 | 8/1991 |

OTHER PUBLICATIONS

International Search Report and Written Opinion mailed Jan. 16, 2009 (PCT/IN2008/000387); ISA/AT.

* cited by examiner

*Primary Examiner* — Max Noori
(74) *Attorney, Agent, or Firm* — Banner & Witcoff, Ltd.

(57) ABSTRACT

The present invention relates to high sensitivity elastic deflection sensors, more particularly related to capacitively coupled FET based elastic deflection sensors. A sub-threshold elastic deflection FET sensor for sensing pressure/force comprises an elastic member forming a moving gate of the sensor, fixed dielectric on substrate of the FET, and a fluid dielectric between the elastic member and the fixed dielectric, wherein alteration in the height of the fluid dielectric ($T_{SENS}$) due to pressure/force on the elastic member varies the sensor gate capacitance.

19 Claims, 3 Drawing Sheets

SUB-THRESHOLD ELASTIC DEFLECTION FET SENSOR FOR SENSING PRESSURE/FORCE, A METHOD AND SYSTEM THEREOF

The present application is a U.S. National Phase filing of International Application No. PCT/IN2008/000387, filed Jun. 19, 2008, which claims priority to India Patent Application No. 00929/CHE/2008, filed Apr. 15, 2008, both of which the present application claims priority to and the benefit of, and both of which are incorporated by reference herein in their entireties.

FIELD OF THE INVENTION

The present invention relates to high sensitivity elastic deflection sensors, more particularly related to capacitively coupled FET based elastic deflection sensors.

BACKGROUND OF THE INVENTION

MEMS structures are mostly dominated by one dimensional structure like beams and two dimensional structures like plates. Measurement of deflection of such elastic structures involves an important element in calibration and testing of MEMS devices. MEMS transducers mostly use piezoelectric, piezoresistive or capacitive as the transduction principles. As piezoresistive sensors are stress sensitive, their performances are closely related to the packaging technologies. Any mechanical stress or thermal mismatch between the sensor chip and the packaging material may cause a large offset voltage and a temperature drift of the output signal. Further, piezoresistance is susceptible to junction leakage and surface contamination. These factors may cause serious stability problems. A disadvantage of piezoelectric sensors is the relatively high noise level. Due to these problems, efforts have been made in the development of micromechanical sensors using capacitive sensing.

An important performance parameter for an elastic deflection sensor is higher overall sensitivity which is dependent on both the mechanical and the electrical sensitivity. The present day deflection measurement principles used in devices like microphones, pressure or any elastic deflection measurement sensors, produce a linear change in the output signal (voltage change) with a variation in the deflection of the elastic member. The present state-of-the-art is mostly based on designing the capacitance detection circuitry so as to be able to pick-up changes as low as femtofarads from electrical point of view as well as making the elastic member sensitive from mechanical point of view.

The design of elastic deformation sensors as applicable to MEMS microphones and pressure sensors has evolved over last 15 years with an aim of increasing sensitivity. The following are some of the design alternatives implemented till date so as to increase the sensitivity of the said sensors.

- In MEMS microphones, the air trapped in between the diaphragm and the back-plate offers resistance to the movement of the diaphragm thus damping the response of the device which leads to a decrease in its sensitivity. As a solution to this, in [1] it has been suggested to decrease the damping due to air by increasing the acoustic hole density in the back-plate.
- The inherent stress in the elastic member due to the deposition process makes it stiffer leading again to reduced sensitivity. The initial stress is regulated by controlling the deposition parameters or by choosing suitable material of the elastic member. An alternative method of increasing its sensitivity as suggested in [2] is to use Polysilicon as the material whose initial stress could be adjusted over a wide range.
- The application of corrugated diaphragms in microphones or capacitive pressure sensors offers the possibility to control the mechanical sensitivity of the diaphragm by means of the dimensions of the corrugations, which are often easier to control than the parameters of a deposition process. A change in the design of the diaphragm by making shallow corrugations on its periphery instead of it being flat was another solution suggested in [3]. Compared to the microphones with conventional flat diaphragms, the microphone with a shallow corrugated diaphragm demonstrated improved sensitivity, especially for a high residual stress level. Similarly the non-planar diaphragms presented in [9] showed higher deflection compared to flat ones.
- Another variation in the diaphragm design was suggested in [4] where the circumferential corrugation rings on the periphery of the diaphragm were replaced by a single deep corrugation. The distinct feature of the design is that the whole sensing area of the diaphragm is at the bottom of the corrugation. Thus, there would be no increase in its bending stiffness, which occurs in shallow corrugated diaphragms [5].
- A highly sensitive silicon condenser microphone with integrated field-effect transistor has also been designed. Here the microphone membrane was suspended at four bending beams only and otherwise free to oscillate when exposed to sound pressure. The device showed a high sensitivity of up to 38 mV/Pa in the frequency range below 10 kHz [6].
- In [7], a silicon condenser microphone with integrated field effect transistor has also been designed where the diaphragm works as the gate of the transistor. The transistor was biased in the ON state and the drain current was the response of the device.
- Employing higher bias voltages i.e., stronger electrical field can increase the open circuit sensitivity, even though it is not preferred in many low voltage applications of microphones [4].
- Reducing the stress of the diaphragm by modification of its supports has also been implemented in [8]. Essentially a diaphragm anchoring scheme was used which made the diaphragm more free to deflect.

Limitations of the Prior Art

- The solutions mentioned so far {[1], [2], [3], [4], [8] and [9]} have targeted control of design and/or the process parameters. The control of process parameters is a tedious way of optimizing the device performance since the reproducibility of fabrication is itself not guaranteed.
- Further, it is always advantageous if the mechanical sensitivity of the elastic structure is not determined by the process parameters.
- As a means of stress relieving, shallow corrugations (the solution suggested in [3]) are a good alternative, but this approach increases the mechanical stiffness while releasing the residual stress. The tradeoff lies in increasing the bending rigidity while decreasing the diaphragm's membrane rigidity. This trade-off usually limits the improvement, especially for a low or moderate stress level of the diaphragm.
- The pull-in voltage of the structure restricts the upper limit of the bias voltage and also increase in bias voltage is not preferred in low voltage applications.

The solution method in [6] gives higher sensitivity but only in the frequency range lower than 10 kHz. Further the device showed a high noise level. Also the transistor was biased and operated in the ON state where the drain current is linearly related to the diaphragm displacement which is also the case for device in [7].

The most critical constraint in all the above mentioned solutions, that stagnates the improvement in sensitivity, is the linear relationship between displacement and capacitance change. Further, the base capacitance is of the range of Pico-farads while the change in capacitance is of the order of alto-farads. Hence sensors based on capacitive sensing require complex front end signal conditioning circuitry.

OBJECTS OF THE INVENTION

The principal object of the present invention is to develop a sub-threshold elastic deflection FET sensor for sensing pressure/force.

Another object of the invention is to develop an elastic member forming a moving gate of the sensor, fixed dielectric on substrate of the FET, and a fluid dielectric between the elastic member and the fixed dielectric.

Still another object of the invention is to develop a method to sense pressure/force using sub-threshold elastic FET sensor.

Still another object of the invention is to observe change in the drain current ($I_D$) of the sensor due to change in the dielectric constant (K) of the sensor caused by the deflection of the elastic member for sensing the sound-pressure/force.

Still another object of the invention is to develop a system for sensing pressure/force generated by any means eg. Sound.

STATEMENT OF THE INVENTION

Accordingly the invention provides for a sub-threshold elastic deflection FET sensor for sensing pressure/force comprising of: an elastic member forming a moving gate of the sensor, fixed dielectric on substrate of the FET, and fluid dielectric between the elastic member and the fixed dielectric, wherein alteration in height of fluid dielectric ($T_{SENS}$) due to pressure/force on the elastic member varies the sensor gate capacitance, also provides for a method to sense pressure/force using sub-threshold elastic FET sensor comprising an act of observing change in drain current ($I_D$) of the sensor due to change in dielectric constant (K) of the sensor caused by deflection of the elastic member for sensing the pressure/force, and it also provides for a system for sensing pressure/force comprising: an elastic member forming a moving gate of the sensor, fixed dielectric on substrate of the FET, and a dielectric of fluid between the elastic member and the fixed dielectric, wherein alteration in the height of the fluid dielectric ($T_{SENS}$) due to pressure/force on the elastic member varies the sensor gate capacitance, a means to operate the sensor in sub-threshold region by applying constant gate-to-source voltage ($V_{GS}$), wherein the voltage ($V_{GS}$) is less than the threshold voltage ($V_T$) of the sensor, and a means to sense the change in the drain current ($I_D$) for sensing the pressure/force.

BRIEF DESCRIPTION OF THE ACCOMPANYING DRAWINGS

DETAILED DESCRIPTION OF THE INVENTION

Figure 1:
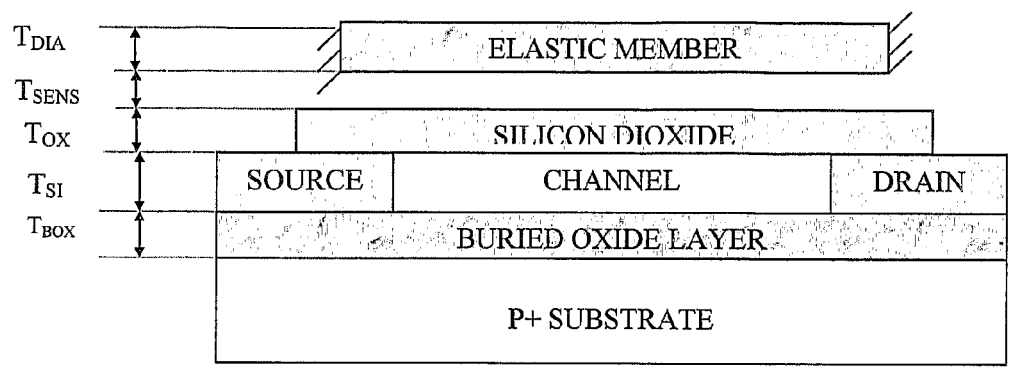
FIG. 1 shows cross sectional view of the moving electrode transistor type elastic deflection sensor.

The present invention is in relation to a sub-threshold elastic deflection FET sensor for sensing pressure/force comprising of: an elastic member forming a moving gate of the sensor, fixed dielectric on substrate of the FET, and fluid dielectric between the elastic member and the fixed dielectric, wherein alteration in height of fluid dielectric ($T_{SENS}$) due to pressure/force on the elastic member varies the sensor gate capacitance.

In yet another embodiment of the present invention the fixed dielectric is selected from a group comprising silicon-dioxide and other suitable high-K material, preferably silicon-dioxide ($SiO_2$).

In still another embodiment of the present invention the fluid dielectric is air and has greater height than that of fixed silicon dioxide ($SiO_2$) dielectric.

In still another embodiment of the present invention the elastic member's profile is selected from a group comprising flat and corrugated, preferably a flat profile.

In still another embodiment of the present invention the elastic member is displaced by applied pressure/force altering the height of the fluid dielectric ($T_{SENS}$), wherein linear change in elastic member displacement results in an exponential change in the drain current ($I_D$) of the sensor.

In still another embodiment of the present invention the sensor is built on a Silicon-On-Insulator (SOI) substrate comprising of a thin film of Silicon (Si) and buried oxide layer of Silicon ($SiO_2$).

In still another embodiment of the present invention the substrate is selected from a group of semi-conducting materials comprising Germanium (Ge), Silicon (Si), and Gallium arsenide (GaAs).

In still another embodiment of the present invention the sensor is implemented with polysilicon gate and diffusion source-drain current junctions or with metal gates and schotky source—drain junctions, or any combinations thereof.

In still another embodiment of the present invention the sensor is adaptable to an array architecture.

In still another embodiment of the present invention the sensor can have an electronic feedback system for maintaining constant drain current ($I_D$) to obtain uniform sensitivity over a wide range of operating conditions.

In still another embodiment of the present invention the sensor is integrated into a standard CMOS process flow on an SOI substrate with a few process steps.

In still another embodiment of the present invention the sensor has plurality of design parameters comprising doping concentration ($N_A$), thickness of silicon film ($T_{SI}$), height of fluid dielectric ($T_{SENS}$) and thickness of Oxide layer ($T_{OX}$), which are optimized to meet specifications or performance of the sensor.

In still another embodiment of the present invention the height of fluid dielectric ($T_{SENS}$) is capable of optimization for a predetermined thickness of $SiO_2$ layer ($T_{OX}$) for improved capacitive coupling and to obtain low threshold voltage ($V_T$).

In still another embodiment of the present invention the elastic sensor is also capable of having plurality of transistors and its measurand can be used to map the deflection profile or the mode shape of the elastic structure.

In still another embodiment of the present invention the elastic deflection FET is operated in fully depleted SOI (Silicon-On-Insulator) mode and the sub-threshold slope of the elastic deflection FET is enhanced due to the fully depleted SOI architecture, which further improves the overall sensitivity of the elastic deflection FET.

In still another embodiment of the present invention the fully depleted SOI mode is configured to give predetermined sensitivity, but elastic deflection FET is also capable of being implemented in Partially Depleted SOI (PDSOI), Dynamically Depleted SOI (DDSOI), bulk MOSFET or similar device structure.

In still another embodiment of the present invention the sensor has predetermined amplification factor which is obtained by biasing the elastic deflection FET in the sub-threshold regime and enables amplification of displacements of the order of nano/pico meters obtained due to the motion of the elastic member.

The present invention is in relation to a method to sense pressure/force using sub-threshold elastic FET sensor comprising of an act of observing change in drain current ($I_D$) of the sensor due to change in dielectric constant (K) of the sensor caused by deflection of the elastic member for sensing the sound-pressure/force.

In still another embodiment of the present invention the sensor is operated by applying a constant gate-to-source voltage ($V_{GS}$), which is less than the threshold voltage ($V_T$) of the FET.

In still another embodiment of the present invention the pressure/force deflects the elastic member resulting in a change in the height of the fluid dielectric.

In still another embodiment of the present invention the elastic member deflections are generated in microphones, pressure sensors or any other suitable candidate for small elastic deflection measurements.

In still another embodiment of the present invention the deflection of the elastic member changes the height of fluid dielectric ($T_{SENS}$) resulting in a change in sensor gate capacitance.

In still another embodiment of the present invention the change in the sensor gate capacitance results in an exponential change in the drain current ($I_D$).

The present invention is in relation to a system for sensing pressure/force comprising: an elastic member forming a moving gate of the sensor, fixed dielectric on substrate of the FET, and, a dielectric of fluid between the elastic member and the fixed dielectric, herein alteration in the height of the fluid dielectric ($T_{SENS}$) due to pressure/force on the elastic member varies the sensor gate capacitance, a means to operate the sensor in sub-threshold region by applying constant gate-to-source voltage ($V_{GS}$), wherein the voltage ($V_{GS}$) is less than the threshold voltage ($V_T$) of the sensor, and a means to sense the change in the drain current ($I_D$) for sensing the pressure/force.

The present invention is an integration of the mechanical transducer and the electronic sensing in a single device structure. A sub-threshold elastic deflection FET where the elastic structure works as the moving gate is used as the deflection sensor. FIG. 1 shows the cross-sectional view of the device. The elastic deflection FET is constructed on a Silicon-On-Insulator (SOI) substrate to enhance the sub-threshold slope. The gate dielectric of elastic deflection FET consists of a very thin SiO$_2$ layer followed by thick air gap. The thin SiO$_2$ layer passivates the interface and the thick air gap ensures that the effective gate capacitance is controlled by the air gap ($C_{SENS}$) rather than oxide ($C_{OX}$).

The source and the drain regions are similar to a conventional MOSFET. The drain current of the elastic deflection FET forms the sensor response. The device is operated by applying a constant $V_{GS}$, which is less than the threshold voltage ($V_T$) of the transistor. Unlike the strong inversion region in which the drift current dominates, sub-threshold conduction is dominated by the diffusion current which is an exponential function of $V_{GS}$ and $V_T$. External stimulus such as force or pressure applied causes the deflection of the elastic structure. The consequent change of the air gap height ($T_{SENS}$) between the gate and the channel results in a change in the gate capacitance and hence an exponential change in the drain current ($I_D$).

Figure 2:
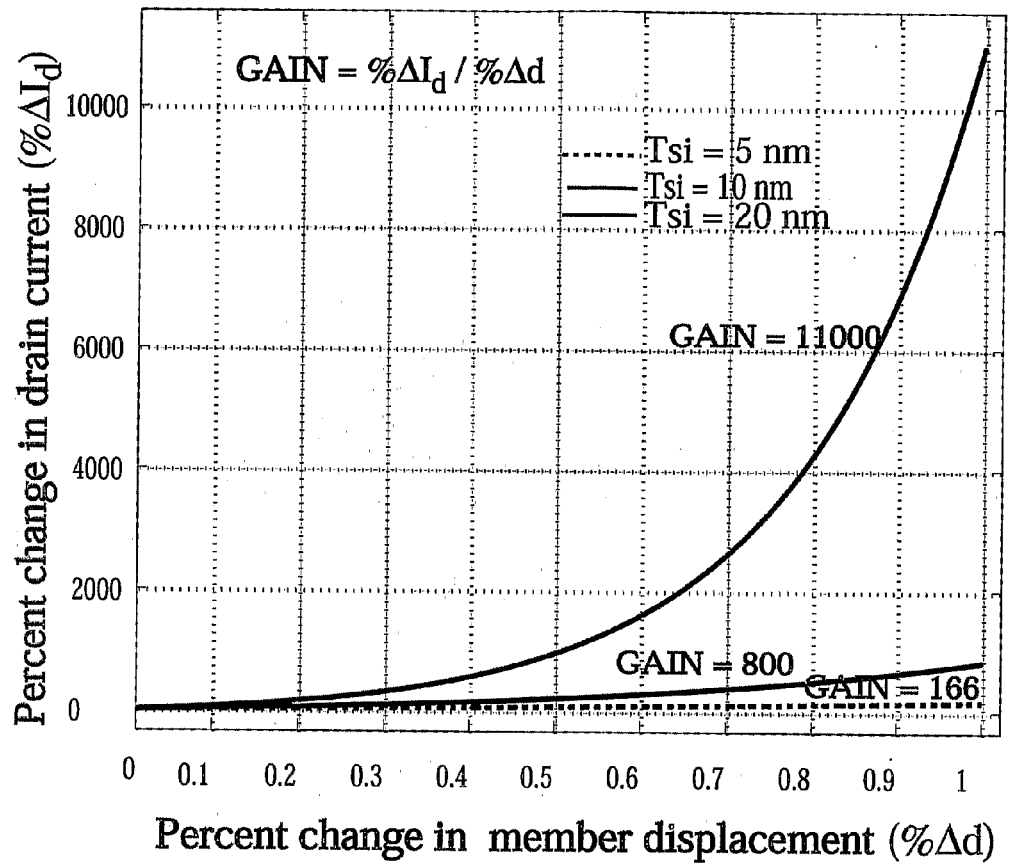
FIG. 2 shows graph of variation of percentage change in drain current for sub threshold region with percent change in elastic member displacement for various silicon thicknesses ($T_{SI}$)
Figure 3:
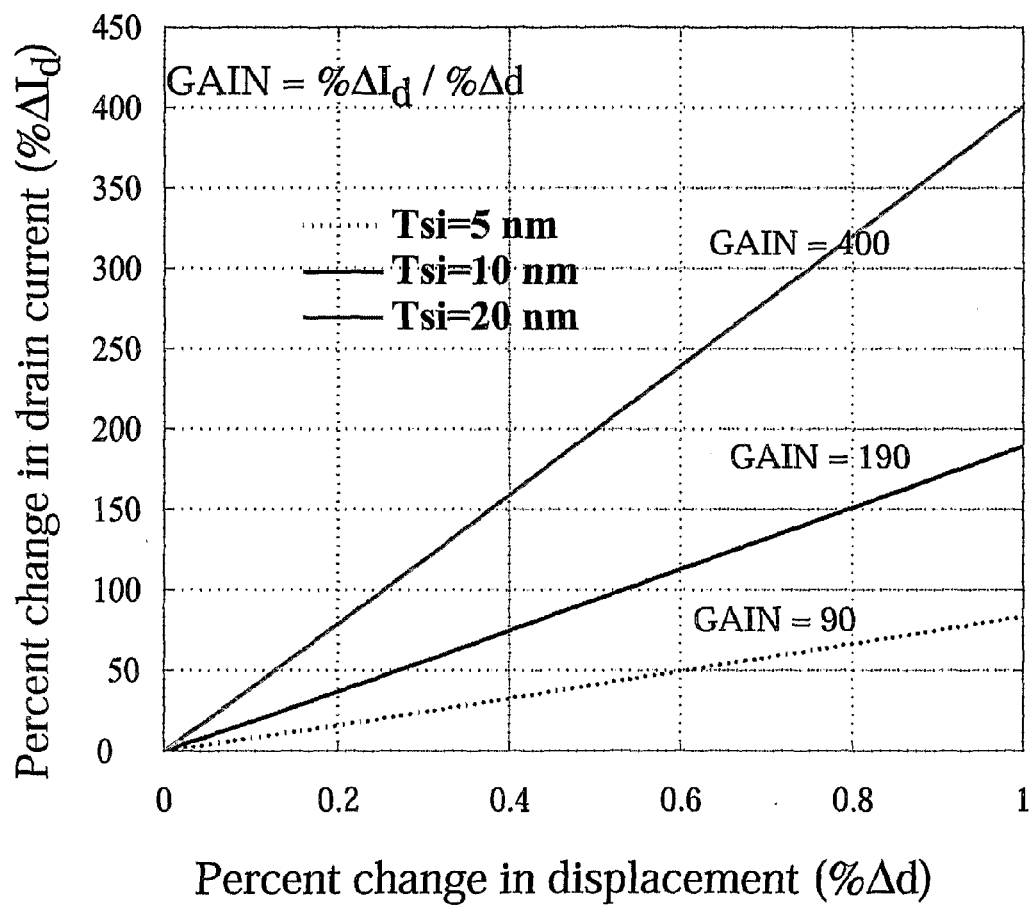
FIG. 3 shows graph of variation of percentage change in drain current for ON region with percent change in elastic member displacement for various silicon thicknesses ($T_{SI}$)

Further, the device is constructed on a Silicon-On-Insulator (SOI) substrate with silicon film thickness ($T_{SI}$) and buried oxide thickness ($T_{BOX}$). The threshold voltage ($V_T$) of the sensor is adjusted by controlling the substrate doping concentration ($N_A$), silicon film thickness ($T_{SI}$), air-gap height ($T_{SENS}$) and oxide layer thickness ($T_{OX}$). When $T_{SI}$ is smaller than the depletion width, the effective silicon depletion capacitance goes down in the fully depleted (SOI) structure, which enhances the sub-threshold slope of the transistor, enabling the sensor to achieve an even higher degree of sensitivity. As shown in FIG. 2, when the device is biased in sub-threshold region and the drain current is the sensor response, for a $T_{BOX}$ of 1 μm, $T_{SENS}$ of 100 nm, $T_{OX}$ of 10 nm, $N_A$ of $5 \times 10^{17}$/cm$^3$, $T_{Si}$ of 20 e-9 m, the gain attained is 11000, thus demonstrating a built-in amplification which is 11000 times the conventional capacitive type sensors where the measurand is the variation in capacitance between the two plates. The sensitivity gain of the device in this case is defined as the ratio of the percentage change in drain current to the percentage change in displacement of the elastic member. Also it should be noted from FIG. 3 that the maximum gain would have been only 400, if the device were to be operated in the ON state (above threshold).

The proposed structure has several design parameters such as $N_A$, $T_{SI}$, $T_{SENS}$ and $T_{OX}$ which can be optimized to meet a given specification of the said sensor.

REFERENCES

[1] Scheeper, P. R., Olthuis, W., Bergveld, P., \A silicon condenser microphone with a silicon nitride diaphragm and backplate", J. Micromech. Microeng, V 2, 1992, pp. 187-89

[2] Altti Torkkeli, Outi Rusanen, Jaakko Saarilahti, Heikki Seppa, Hannu Sipola, Jarmo Hietanen, "Capacitive microphone with low-stress polysilicon membrane and high-stress polysilicon backplate", Sensors and Actuators, V 85, 2000, pp. 116-123

[3] Scheeper, P. R., Olthuis, W., Bergveld, P., "The Design, Fabrication, and Testing of Corrugated Silicon Nitride Diaphragms", J. of Microelecromechanical systems, V 3, No. 1, 1994

[4] Xinxin Li, Rongming Lin, Huatsoon kek, Jianmin Miao, Quanbo Zou, "Sensitivity improved silicon condenser microphone with a novel single deeply corrugated diaphragm", Sensors and Actuator A, V 92, 2001, pp. 257-262

[5] Wang, W. J., Lin, R. M., Li, X., Guo, D. G., Quanbo Zou, "Study of single deeply corrugated diaphragms for high-sensitivity microphones", J. Micromech. Microeng., V 13, 2003, pp. 184-189

[6] Graf, E., Kronast, W., Duhrmg, S., Muller, B., Stoffel, A., "Silicon membrane condenser microphone with integrated field effect transistor", Sensors and Actuators A, V 33-38, 1993, pp. 708-711
[7] Kuhnel, W., "Silicon Condenser Microphone with Integrated Field effect Transistor", Sensors and Actuators A, V 25-27, 1991, pp. 521-525
[8] Loeppert, Peter, V. et al, "Silicon Microphone", PCT/US02/32749, 30th May, 2003
[9] Yafan, Z., Kensall, D., "Performance of Non-Planar Silicon Diaphragms under Large Defections", J. of Microelecromechanical systems, V 3, No. 2, 1994

We claim:

1. A Field Effect Transistor (FET) sensor for sensing pressure/force, said FET sensor comprising:
   a. an elastic member forming a moving gate of the FET sensor,
   b. a fixed dielectric on a substrate of the FET sensor, wherein said substrate comprises a thin film of a semi-conducting material and a buried oxide layer of Silicon, and
   c. a fluid dielectric formed between the elastic member and the fixed dielectric, wherein the FET sensor is operated in a sub threshold region for sensing the pressure/force on the elastic member, wherein the pressure/force alters a height of said fluid dielectric due to pressure/force on the elastic member thereby varying gate capacitance of the FET sensor for measuring the pressure/force.

2. The FET sensor as claimed in claim 1, wherein the fixed dielectric is silicon-dioxide.

3. The FET sensor as claimed in claim 1, wherein the fluid dielectric is air having a height more than that of the fixed dielectric.

4. The FET sensor as claimed in claim 1, wherein the elastic member's profile is one of flat and corrugated.

5. The FET sensor as claimed in claim 1, wherein the elastic member is displaced by applied pressure/force altering the height of the fluid dielectric.

6. The FET sensor as claimed in claim 1, wherein the semi-conducting material is selected from a group consisting of Germanium (Ge), Silicon (Si), and Gallium arsenide (GaAs).

7. The FET sensor as claimed in claim 1, wherein the FET sensor is implemented with one of polysilicon gate and diffusion source-drain junctions, metal gates and schotky source drain junctions, or any combinations thereof.

8. The FET sensor as claimed in claim 1, wherein the FET sensor maintains a constant drain current to obtain uniform sensitivity over a wide range of operating conditions.

9. The FET sensor as claimed in claim 1, wherein the height of the fluid dielectric is optimized to a predetermined thickness of the fixed dielectric to improve capacitive coupling, thereby obtaining low threshold voltage.

10. The FET sensor as claimed in claim 1, wherein the FET sensor is operated in fully depleted SOI (Silicon-On-Insulator) mode and the sub-threshold slope of the FET sensor is enhanced due to the fully depleted SOI architecture, which further improves the overall sensitivity of the FET sensor.

11. The FET sensor as claimed in claim 10, wherein the fully depleted SOI mode is configured to provide predetermined sensitivity.

12. The FET sensor as claimed in claim 1, wherein the FET sensor has predetermined amplification factor which is obtained by biasing the FET sensor in the sub-threshold region to enable amplification of displacements of the order of nano/pico meters obtained due to the motion of the elastic member.

13. A method to sense pressure/force using the FET sensor as claimed in claim 1, said method comprising an act of observing a change in drain current of the FET sensor due to change in capacitive coupling of the FET sensor caused by deflection of the elastic member for sensing the pressure/force.

14. The method as claimed in claim 13, wherein the sensor is operated by applying a constant gate-to-source voltage, which is less than a threshold voltage of the FET sensor.

15. The method as claimed in claim 13, wherein the pressure/force deflects the elastic member resulting in a change in the height of the fluid dielectric.

16. The method as claimed in claim 13, wherein the elastic member deflections are generated in microphones, pressure sensors or any other elastic deflection measurements.

17. The method as claimed in claim 13, wherein the deflection of the elastic member changes the height of the fluid dielectric resulting in a change in gate capacitance.

18. The method as claimed in claim 13, wherein a change in the gate capacitance results in an exponential change in the drain current.

19. The method as claimed in claim 17, wherein the change in the gate capacitance results in an exponential change in the drain current.

* * * * *